United States Patent
Kogure et al.

(10) Patent No.: US 8,653,846 B2
(45) Date of Patent: Feb. 18, 2014

(54) ELECTRONIC DEVICE MOUNTING APPARATUS AND METHOD OF MOUNTING ELECTRONIC DEVICE

(75) Inventors: Yoshinari Kogure, Tokyo (JP); Yasuhide Takeda, Tokyo (JP)

(73) Assignee: Advantest Corporation, Tokyo (JP)

( * ) Notice: Subject to any disclaimer, the term of this patent is extended or adjusted under 35 U.S.C. 154(b) by 434 days.

(21) Appl. No.: 12/898,010

(22) Filed: Oct. 5, 2010

(65) Prior Publication Data

US 2011/0089968 A1    Apr. 21, 2011

(30) Foreign Application Priority Data

Oct. 19, 2009  (JP) ................................. 2009-240654

(51) Int. Cl.
    *G01R 31/20* (2006.01)
(52) U.S. Cl.
    USPC ............ 324/757.01; 324/756.01; 324/756.02; 324/756.05; 324/757.02; 324/757.03; 361/760; 361/757; 361/802; 174/250; 174/257; 174/260; 382/141; 382/145; 382/146; 382/151; 384/86; 384/87; 384/90; 384/94; 384/95; 29/832; 29/833; 29/739; 29/741
(58) Field of Classification Search
    USPC ............. 324/757.01, 757.02, 757.03, 757.04, 324/756.01, 756.02, 756.03, 756.04, 324/756.05, 757.07, 755, 756, 758, 765, 324/762.01, 762.02, 763.01; 361/749, 760, 361/767, 802; 216/14; 427/117; 174/250, 174/257, 260; 716/15; 382/141, 145, 146, 382/151; 348/86, 87, 90, 94, 95; 29/832, 29/833, 739, 741
    See application file for complete search history.

(56) References Cited

U.S. PATENT DOCUMENTS

| 4,411,719 | A | * | 10/1983 | Lindberg ........................ 156/64 |
| 5,138,368 | A | * | 8/1992 | Kahn et al. ..................... 355/53 |
| 5,390,079 | A | * | 2/1995 | Aomori et al. ................ 361/749 |
| 5,516,023 | A | * | 5/1996 | Kono ............................ 228/4.5 |
| 5,567,165 | A | | 10/1996 | Matsuoka |
| 5,702,049 | A | * | 12/1997 | Biggs et al. ................... 228/105 |
| 5,757,199 | A | | 5/1998 | Maruyama |

(Continued)

FOREIGN PATENT DOCUMENTS

| JP | 7-201429 | 8/1995 |
| JP | 7-263504 | 10/1995 |

(Continued)

OTHER PUBLICATIONS

Japan Office action, mail date is Nov. 12, 2013.

*Primary Examiner* — Patrick Assouad
*Assistant Examiner* — Alexander J Nemtzow
(74) *Attorney, Agent, or Firm* — Greenblum & Bernstein P.L.C.

(57) ABSTRACT

The electronic device mounting apparatus 1 comprises: a first camera 123 for imaging a flexible board 74 of a base member 70 of a test carrier 60 to generate a first image information; an image processing apparatus 40 for detecting a position of an alignment mark 79 of the flexible board 74 from the first image information and calculating a print start position 782 of the first interconnect patterns 78 on the flexible board 74 on the basis of the position of the alignment mark 79; a printing head 122 for forming a first interconnect pattern 78 on the flexible board 74 from the print start position 782; and a second conveyor arm 21 for mounting a die 90 on the flexible board 74 on which the first interconnect pattern 78 is formed.

14 Claims, 18 Drawing Sheets

(56) References Cited

U.S. PATENT DOCUMENTS

| | | |
|---|---|---|
| 5,828,224 A | 10/1998 | Maruyama |
| 5,986,459 A | 11/1999 | Fukuya et al. |
| 6,195,454 B1* | 2/2001 | Yazawa ............... 382/151 |
| 6,647,138 B1 | 11/2003 | Sakaguchi |
| 6,900,459 B2* | 5/2005 | Farnworth et al. ............ 257/48 |
| 7,863,916 B2 | 1/2011 | Nishiura |
| 2004/0049912 A1* | 3/2004 | Akagawa et al. ............... 29/846 |
| 2006/0159899 A1* | 7/2006 | Edwards et al. ............. 428/209 |
| 2006/0207091 A1* | 9/2006 | Takahashi ..................... 29/833 |
| 2006/0290369 A1* | 12/2006 | Yamashita et al. ........... 324/765 |
| 2007/0069752 A1* | 3/2007 | Ito et al. ....................... 324/765 |
| 2009/0237100 A1 | 9/2009 | Namiki et al. |
| 2010/0126289 A1 | 5/2010 | Kinoshita |
| 2010/0194420 A1 | 8/2010 | Kitazume et al. |

FOREIGN PATENT DOCUMENTS

| | | |
|---|---|---|
| JP | 10-068758 | 3/1998 |
| JP | 10-213626 | 8/1998 |
| JP | 10-213627 | 8/1998 |
| JP | 11-326449 | 11/1999 |
| JP | 2003-344484 | 12/2003 |
| JP | 3491700 | 1/2004 |
| KR | 10-0342031 | 7/2002 |

* cited by examiner

ELECTRONIC DEVICE MOUNTING APPARATUS AND METHOD OF MOUNTING ELECTRONIC DEVICE

TECHNICAL FIELD

The present invention relates to an electronic device mounting apparatus and electronic device mounting method temporarily mounting a die on a test carrier for testing an integrated circuit device and other electronic circuit devices built into the die.

The contents described and/or illustrated in the documents relevant to Japanese Patent Application No, 2009-240654 filed on Oct. 19, 2009 will be incorporated herein by reference, as a part of the description and/or drawings of the present application.

BACKGROUND ART

As a test carrier on which a die diced from a semiconductor wafer is temporarily mounted, one which sandwiches the die between two films is known (for example, see PLT 1).

CITATION LIST

Patent Literature

PLT 1: Japanese Patent Publication (A) No. 2003-344484

SUMMARY OF INVENTION

Technical Problem

In such a test carrier, the handling ability is improved by adding a rigid board to the outer circumference of a film. Further, by printing interconnect patterns on the films right before mounting the die, it is possible to deal with even dies having narrow pitch bumps.

However, when a film is offset relative to the rigid board, there is the problem that it is not possible to accurately form interconnect patterns on the film.

The problem to be solved by the present invention is to provide an electronic device mounting apparatus and electronic device mounting method able to accurately form interconnect patterns on a test carrier.

Solution to Problem

[1] An electronic device mounting apparatus according to the present invention is an electronic device mounting apparatus temporarily mounting an electronic device on a test carrier for testing, the test carrier having a first board and a second board laid over the first board, the electronic device mounting apparatus comprising: a first imaging device configured to image the second board to generate a first image information; a first recognizing device configured to detect a position of a first predetermined part of the second board from the first image information and recognize a forming start position of a first interconnect pattern on the second board on the basis of the position of the first predetermined part; an interconnect forming device configured to form the first interconnect pattern on the second board from the forming start position; and a mounter configured to mount the electronic device on the second board on which the first interconnect patterns is formed.

[2] In the above invention, the first predetermined part of the second board may be a mark formed on a surface of the second board.

[3] In the above invention, the apparatus may further be comprises: a second imaging device configured to image the electronic device to generate a second image information; and a second recognizing device configured to detect a position of an input/output terminal of the electronic device from the second image information and recognize a pad forming position on the second board on the basis of the position of the input/output terminal, and the interconnect forming device may form the interconnect pattern between the forming start position and the pad forming position.

[4] In the above invention, the apparatus may further comprises: a third imaging device configured to image the second board and the electronic device mounted on the second board to generate a third image information; and a third recognizing device configured to detect a position of an input/output terminal of the electronic device and a position of a pad on the second board from the third image information and recognize a first offset amount of the input/output terminal with respect to the pad on the basis of the position of the input/output terminal and the position of the pad.

[5] In the above invention, the mounter may mount the electronic device on the second board so as to cancel the first offset amount.

[6] In the above invention, the second board which the third imaging device images may be a calibration-use board comprising a thin film.

[7] In the above invention, the apparatus may further comprises a fourth recognizing device configured to detect a position of a second predetermined part of the second board from a fourth image information which the first imaging device generates by imaging the second board, detect a position of a calibration-use pattern from a fifth image information which the first imaging device generates by imaging the second board on which the interconnect forming device forms the calibration-use pattern, and recognize a second offset amount of the first imaging device with respect to the interconnect forming device on the basis of the position of the second predetermined part and the position of the calibration-use pattern.

[8] In the above invention, the interconnect forming device may form the interconnect pattern on the second board so as to cancel the second offset amount.

[9] In the above invention, the interconnect forming device may print the first interconnect pattern on the second board by ink jet printing.

[10] In the above invention, the test carrier may have: a first region in which the first interconnect pattern is to be printed by the interconnect forming device; and a second region in which a second interconnect pattern is formed in advance.

[11] In the above invention, the electronic device may be a die diced from a semiconductor wafer.

[12] An electronic device mounting method according to the present invention is an electronic device mounting method temporarily mounting an electronic device on a test carrier for testing, the test carrier having a first board and a second board laid over the first board, the electronic device mounting method comprising: (a) imaging the second board to generate a first image information; (b) detecting a position of a first predetermined part of the second board from the first image information and recognizing a forming start position of a first interconnect pattern on the second board on the basis of the position of the first predetermined part; (c) forming the first interconnect pattern on the second board from the forming start position; and (d) mounting the electronic device on the second board on which the first interconnect pattern is formed.

[13] In the above invention, the first predetermined part of the second board may be a mark formed on a surface of the second board.

[14] In the above invention, the method may further comprises: (e) imaging the electronic device to generate a second image information; and (f) detecting a position of an input/output terminal of the electronic device from the second image information and recognizing a pad forming position on the second board on the basis of the position of the input/output terminal; and the interconnect pattern may be formed between the forming start position and the pad forming position at the (c).

[15] In the above invention, the method may further comprises: (g) imaging the second board and the electronic device mounted on the second board to generate a third image information; and (h) detecting a position of an input/output terminal of the electronic device and a position of a pad on the second board from the third image information and recognizing a first offset amount of the input/output terminal with respect to the pad on the basis of the position of the input/output terminal and the position of the pad.

[16] In the above invention, the electronic device may be mounted on the second board at the (d) so as to cancel the first offset amount.

[17] In the above invention, the second board which is imaged at the (g) may be a calibration-use board comprising a thin film.

[18] In the above invention, the method may further comprises: (i) using a first imaging device to image the second board to generate a fourth image information; (j) detecting the position of a second predetermined part of the second board from the fourth image information; (k) using an interconnect forming device to form a calibration-use pattern on the second board; (l) using the first imaging device to image the second board on which the calibration-use pattern is formed to generate a fifth image information; (m) detecting a position of the calibration-use pattern from the fifth image information; and (n) recognizing a second offset amount of the first imaging device with respect to the interconnect forming device on the basis of the position of the second predetermined part and the position of the calibration-use pattern.

[19] In the above invention, the interconnect pattern may be formed on the second board at the (c) so as to cancel the second offset amount.

[20] In the above invention, the first interconnect pattern may be printed on the second board by ink jet printing at the (c).

[21] In the above invention, the test carrier may have: a first region in which the first interconnect pattern is to be printed at the (c); and a second region in which second interconnect pattern is formed in advance.

[22] In the above invention, the electronic device may be a die diced from a semiconductor wafer.

Advantageous Effects of Invention

In the present invention, the forming start position of the interconnect pattern on the second board are recognized on the basis of the position of the predetermined part of the second board, so it is possible to accurately form the interconnect pattern on the second board.

EMBODIMENTS OF INVENTION

Below, embodiments of the present invention will be explained based on the drawings.

Figure 1:
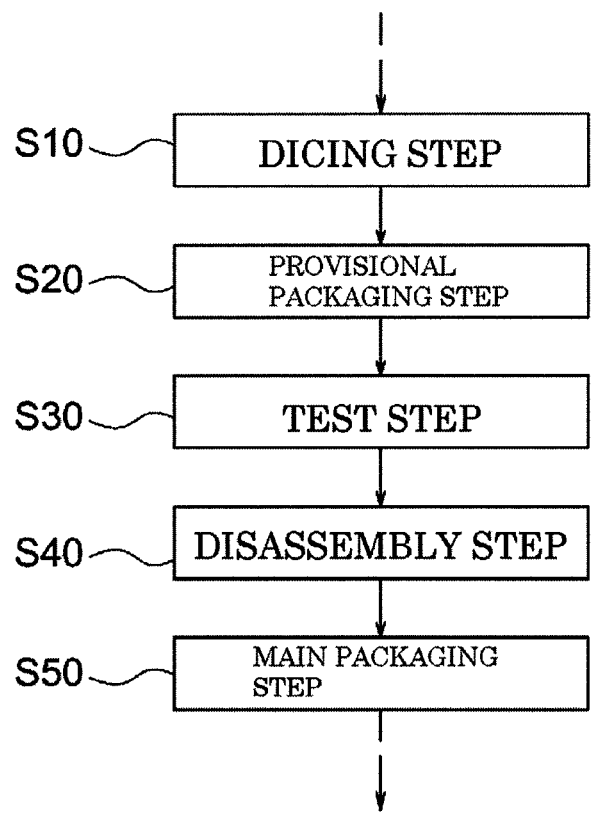
FIG. 1 is a flow chart showing a part of a device production process in an embodiment of the present invention.

FIG. 1 is a flow chart showing a part of a device production process in the present embodiment.

In the present embodiment, after a die is diced from a disk-shaped semiconductor wafer (after step S10 of FIG. 1) and before performing final packaging (before step S50), an electronic circuit device built into the die is tested (steps S20 to S40). At this time, in the present embodiment, first, the die 90 is temporarily mounted in a test carrier 60 (step S20). Next the die 90 and a test apparatus (not shown) are electrically connected through this test carrier 60 and the electronic circuit device built in the die 90 is tested (step S30). Further, after this test ends, the die 90 is taken out from the test carrier 60 (step S40), then this die 90 is packaged to complete the device as a final product (step S50).

First, the configuration of the test carrier 60 in which the die 90 is temporarily mounted (provisionally packaged) for testing in the present embodiment will be explained.

Figure 4:
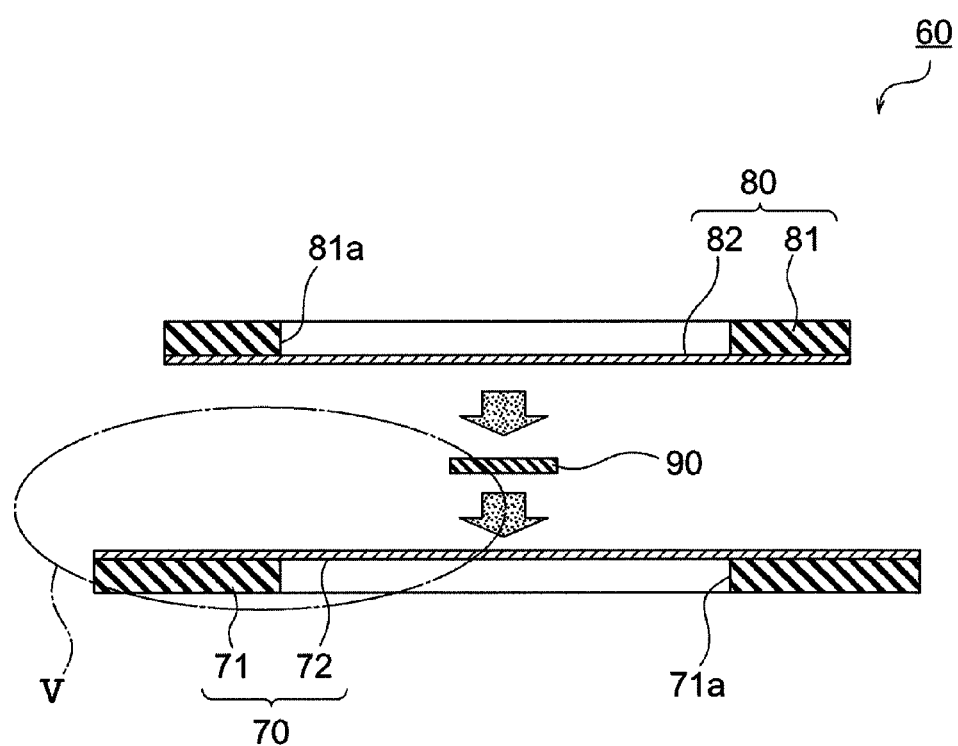
FIG. 4 is a disassembled cross-sectional view of a test carrier in an embodiment of the present invention.
Figure 5:
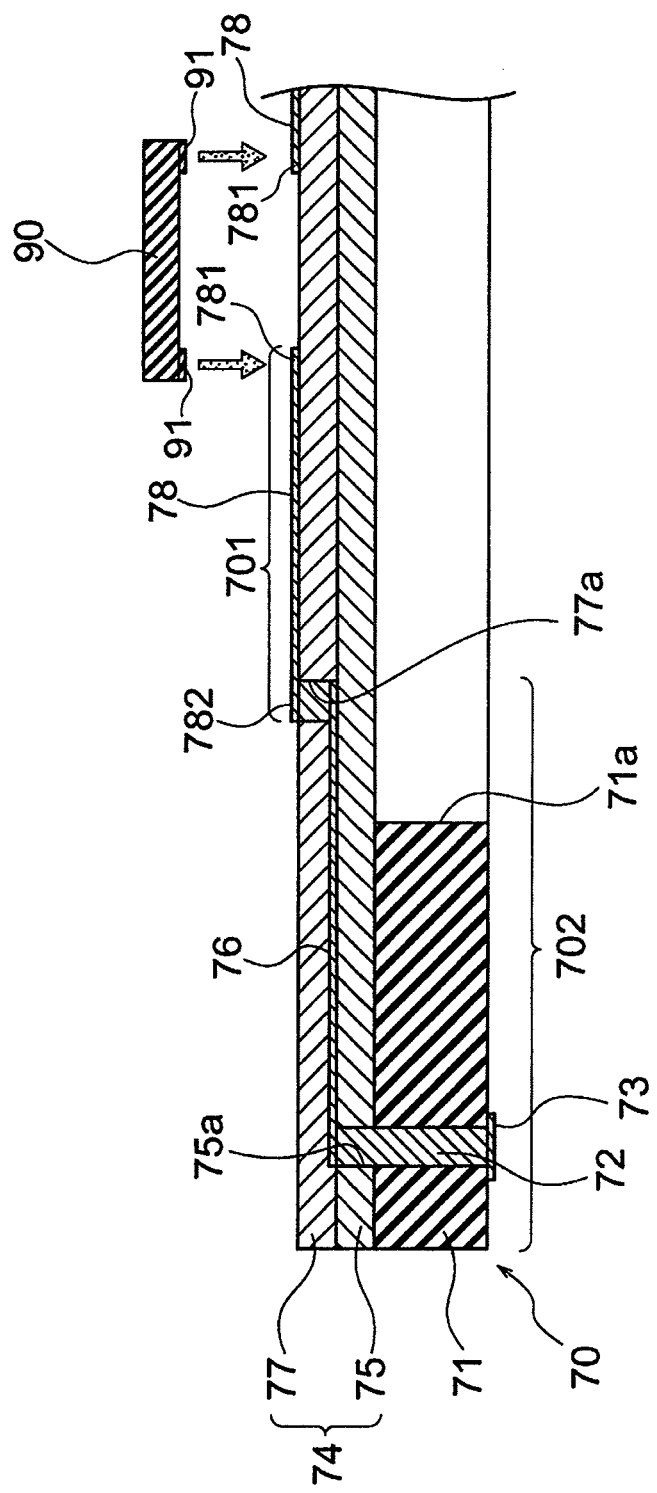
FIG. 5 is an enlarged view of a part V of FIG. 4.
Figure 6:
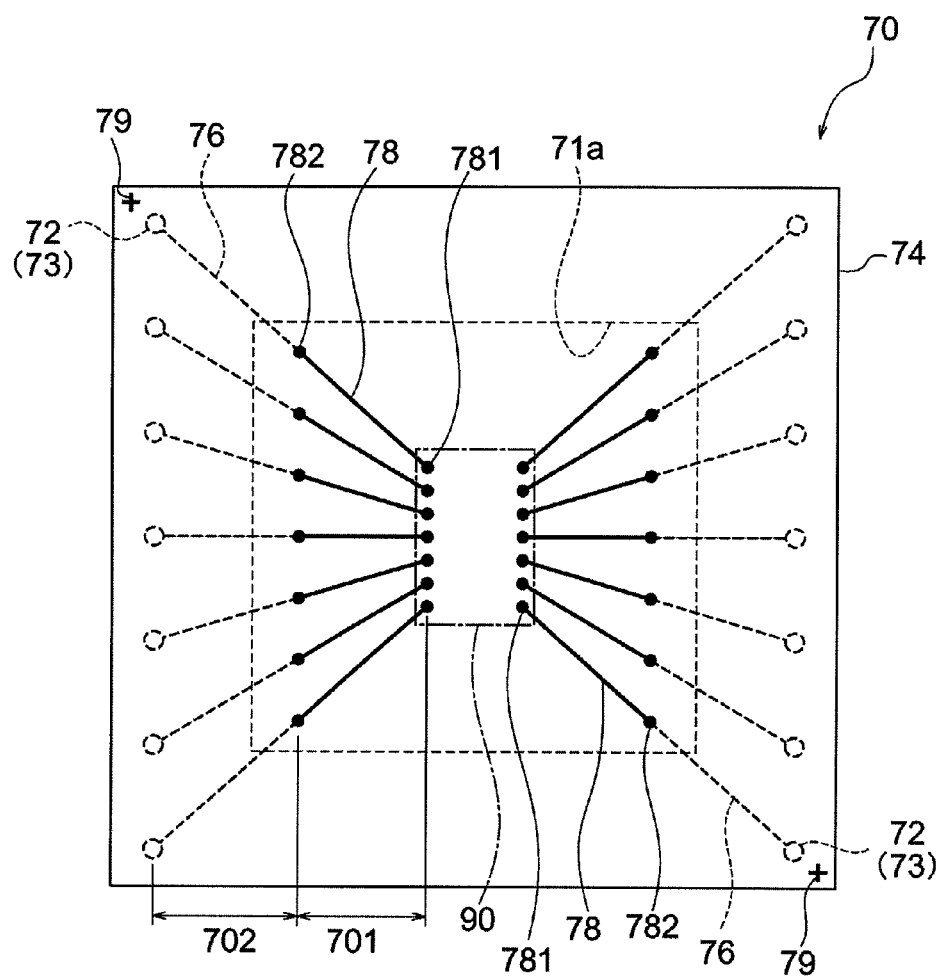
FIG. 6 is a plan view of a base member of a test carrier in an embodiment of the present invention.

FIG. 2 to FIG. 5 are views showing a test carrier in the present embodiment, while FIG. 6 is a plan view showing a base member of the test carrier.

Figure 2:
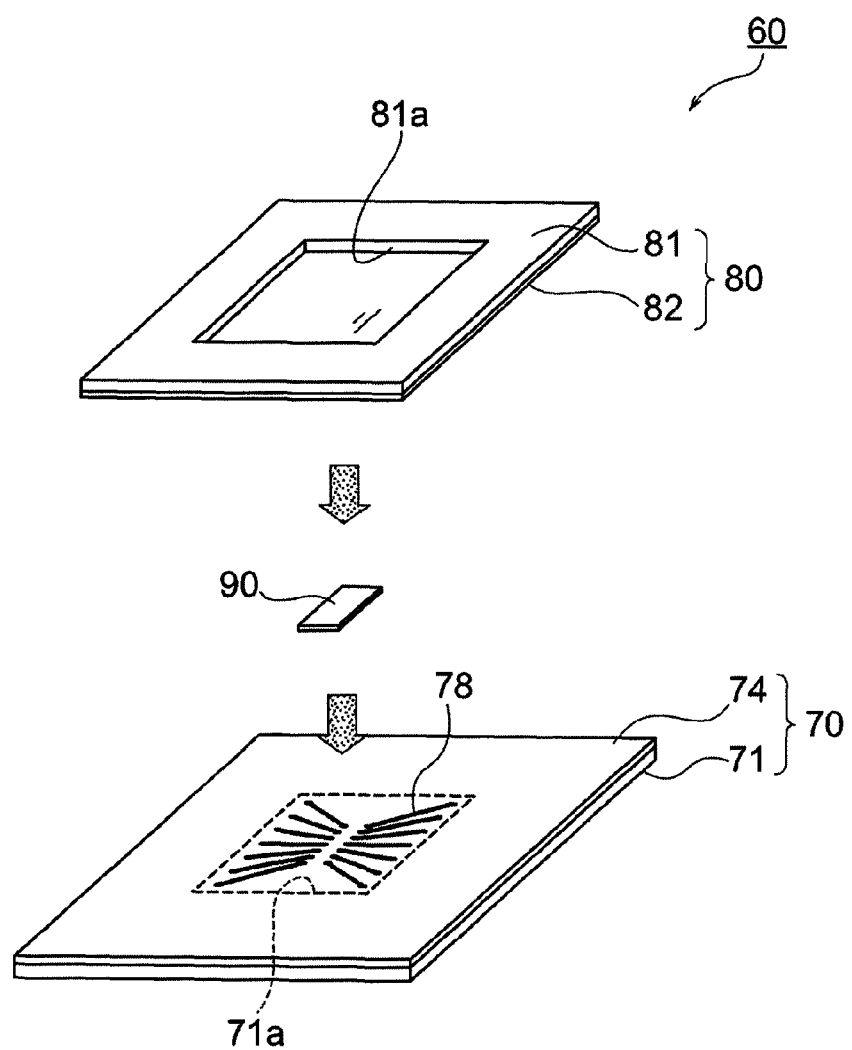
FIG. 2 is a disassembled perspective view of a test carrier in an embodiment of the present invention.
Figure 3:
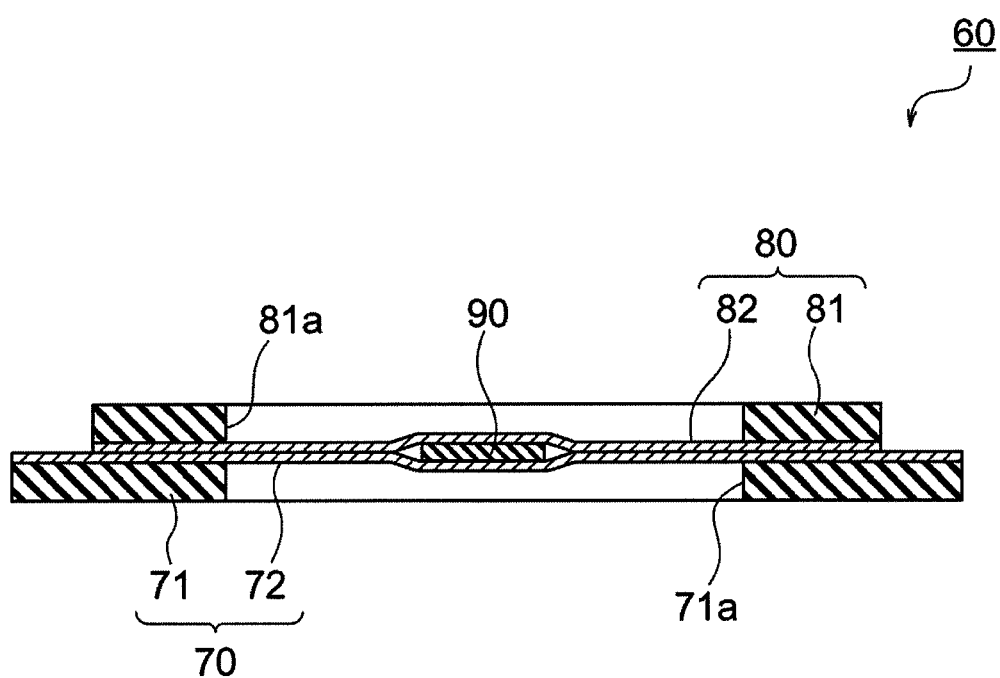
FIG. 3 is a cross-sectional view of a test carrier in an embodiment of the present invention.

The test carrier 60 in the present embodiment, as shown in FIG. 2 to FIG. 4, comprises: a base member 70 on which interconnect patterns 76, 78 (see FIG. 5 and FIG. 6) are formed and on which the die 90 is to be mounted; and a cover member 80 covered over this base member 70. This test carrier 60 sandwiches the die 90 between the base member 70 and the cover member 80 so as to hold the die 90.

The base member 70 comprises: a rigid board 71 at the center of which an opening 71a is formed; and a flexible board 74 laid over the entire surface of the rigid board 71 including the center opening 71a. Therefore, the flexible board 74 is designed to be able to deform at its center part, while is designed to be unable to deform at its outer circumference due to the rigid board 71. Thereby the handling ability of the test carrier 60 is improved.

As specific examples of the rigid board 71, for example, a single layer board or a multilayer board etc. made of a polyamide imide resin or ceramic, glass, etc. may be mentioned. On the other hand, as specific examples of the flexible board 74, for example, a single layer board or a multilayer board etc. made of a polyimide resin etc. may be mentioned.

The flexible board 74, as shown in FIG. 5 and FIG. 6, has a base film 75 on which second interconnect patterns 76 are formed and a coverlay 77 covering this base film 75.

The second interconnect patterns 76, for example, are formed in advance by etching copper foil laminated on the base film 75. On the other hand, the first interconnect patterns 78 is formed on the surface of the coverlay 77 by ink jet printing. The first interconnect patterns 78 are printed in real time by a later explained interconnect forming module 12 of a die mounting apparatus 1 right before mounting the die 90 on the base member 70.

One end of the first interconnect pattern 78 is connected to one end of the second interconnect pattern 76 via a through hole 77a formed in the coverlay 77. On the other hand, other end of the first interconnect pattern 78 is formed with a pad 781 to which an input/output terminal 91 of the die 90 is connected. Note that, the one end of the first interconnect pattern 78 corresponds to a start position 782 of printing by the later explained interconnect forming module 12 (a print start position).

A through hole 72 penetrates at the position of the rigid board 71 corresponding to the other end of the second interconnect pattern 76. The second interconnect pattern 76 is connected to the through holes 72 via a through hole 75a formed in the base film 75. This through hole 72 is connected to a connection terminal 73 formed on the bottom surface of the rigid board 71. The connection terminal 73 are electrically contacted by a contractor of the test apparatus when testing an electronic circuit device built into a die 90. Note that, the other end of the second interconnect pattern 76 may be positioned inside the center opening 71a of the rigid board 71 and the connection terminal 73 may be formed on the back surface of the flexible board 74.

As explained above, in the present embodiment, as shown in FIGS. 5 and 6, the base member 70 has: a first region 701 in which the first interconnect patterns 78 are formed by ink jet printing in real time; and a second region 702 in which second interconnect patterns 76 are formed in advance. By adopting such a configuration, the range of printing of the ink jet printing becomes smaller, so the printing time of the first interconnect patterns 78 can be shortened. Note that, in the second region 702, the second interconnect patterns 76 may also be formed on the rigid board 71.

Further, as shown in FIG. 6, alignment marks 79 used for recognition etc. of the print start positions 782 of the first interconnect patterns 78 are formed at two corners of the surface of the coverlay 77 positioned on a diagonal line. Note that, so long as the alignment marks are formed at two or more locations on the surface of the coverlay, the number of alignment marks and the positions of formation are not particularly limited. Further, in the present embodiment, the alignment mark 79 is a cross shape, but the mark is not particularly limited to such shape.

Returning to FIG. 2 to FIG. 4, the cover member 80 also comprises: a rigid board 81 at the center of which an opening 81a is formed; and a flexible board 82 laid over this rigid board 81. Therefore, in the same way as the base member 70, the flexible board 82 is designed to be able to deform at the center, while is designed to be unable to deform at its outer circumference due to the rigid board 81.

As specific examples of the rigid board 81, in the same way as the above-mentioned rigid board 71, for example, a single layer board or a multilayer board etc. made of a polyamide imide resin, ceramic, glass, etc. may be mentioned. On the other hand, as specific examples of the flexible board 82, in the same way as the above-mentioned flexible board 74, for example, a single layer board or multilayer board etc. made of a polyimide resin may be mentioned.

Note that, the cover member 80 may be configured by only the flexible board 82 or may be configured by only the rigid board 81 without the opening 81a. Further, in the present embodiment, the cover member 80 is not formed with interconnect patterns, but the invention is not particularly limited to this. Instead of the base member 70 or in addition to the base member 70, the cover member 80 may also be formed with interconnect patterns. Further, if the cover member 80 has a flexible board 82, the flexible board 74 of the base member 70 may be replaced by a rigid board.

The above explained test carrier 60 has a die 90 mounted to it in the following way. That is, the input/output terminals 91 are aligned with the pads 781, in that state, the die 90 is mounted on the base member 70, then the cover member 80 is laid over the base member 70 under reduced pressure. Next, in the state with the die 90 sandwiched between the base member 70 and the cover member 80, the pressure is returned to atmospheric pressure, whereby the die 90 is held between the base member 70 and the cover member 80. Note that, when the die 90 is relatively thick, conversely of the configuration shown in FIG. 3, the base member 70 and the cover member 80 may be overlaid so that the rigid boards 71, 81 directly contact each other.

Next, the die mounting apparatus 1 used in the provisional packaging process (step S20 of FIG. 1) will be explained.

Figure 7:
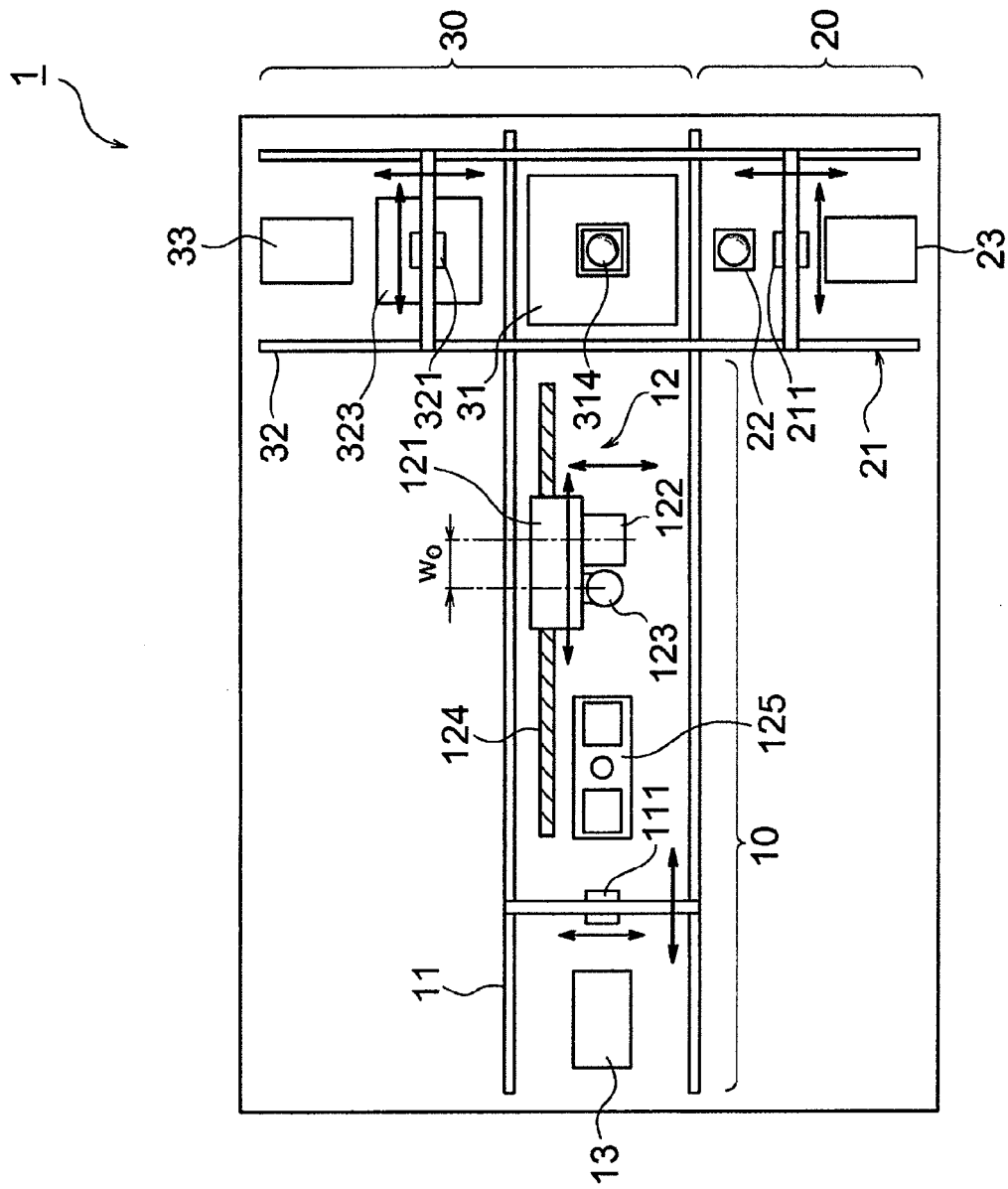
FIG. 7 is a plan view of the overall configuration of a die mounting apparatus in an embodiment of the present invention.
Figure 8:
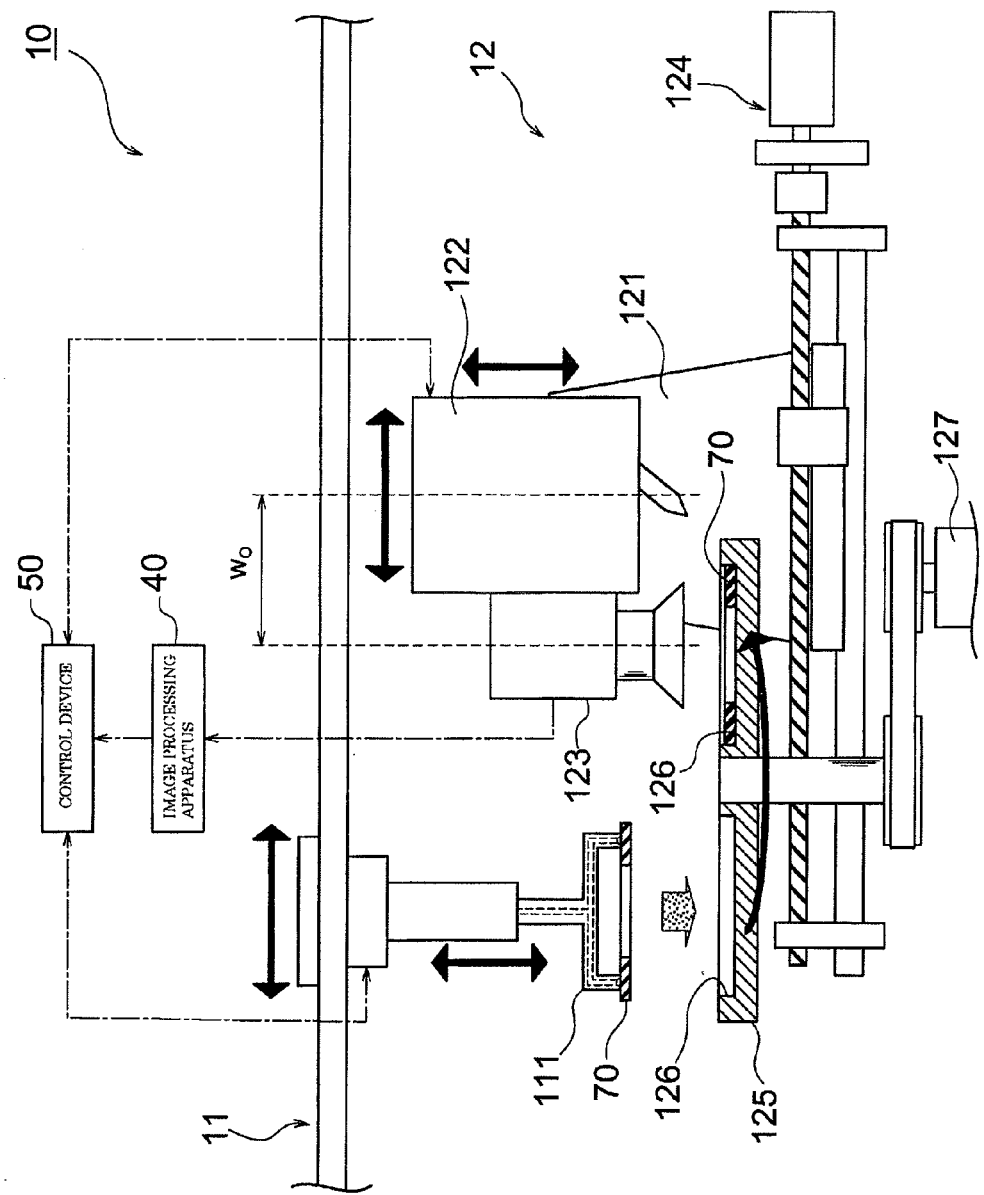
FIG. 8 is a side view of a base feeding unit of a die mounting apparatus of FIG. 7.
Figure 9:
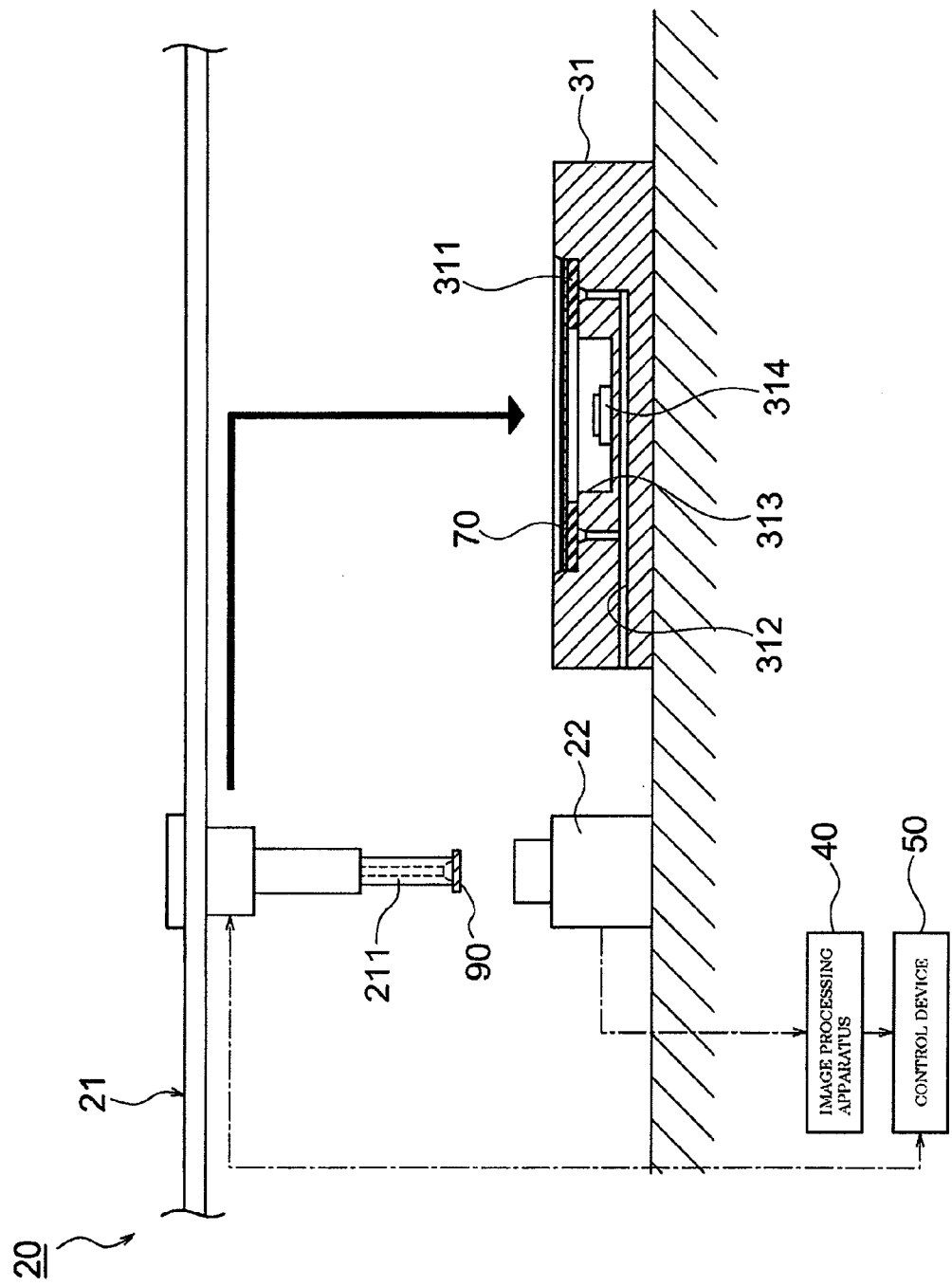
FIG. 9 is a side view of a die feeding unit of a die mounting apparatus of FIG. 7.
Figure 10:
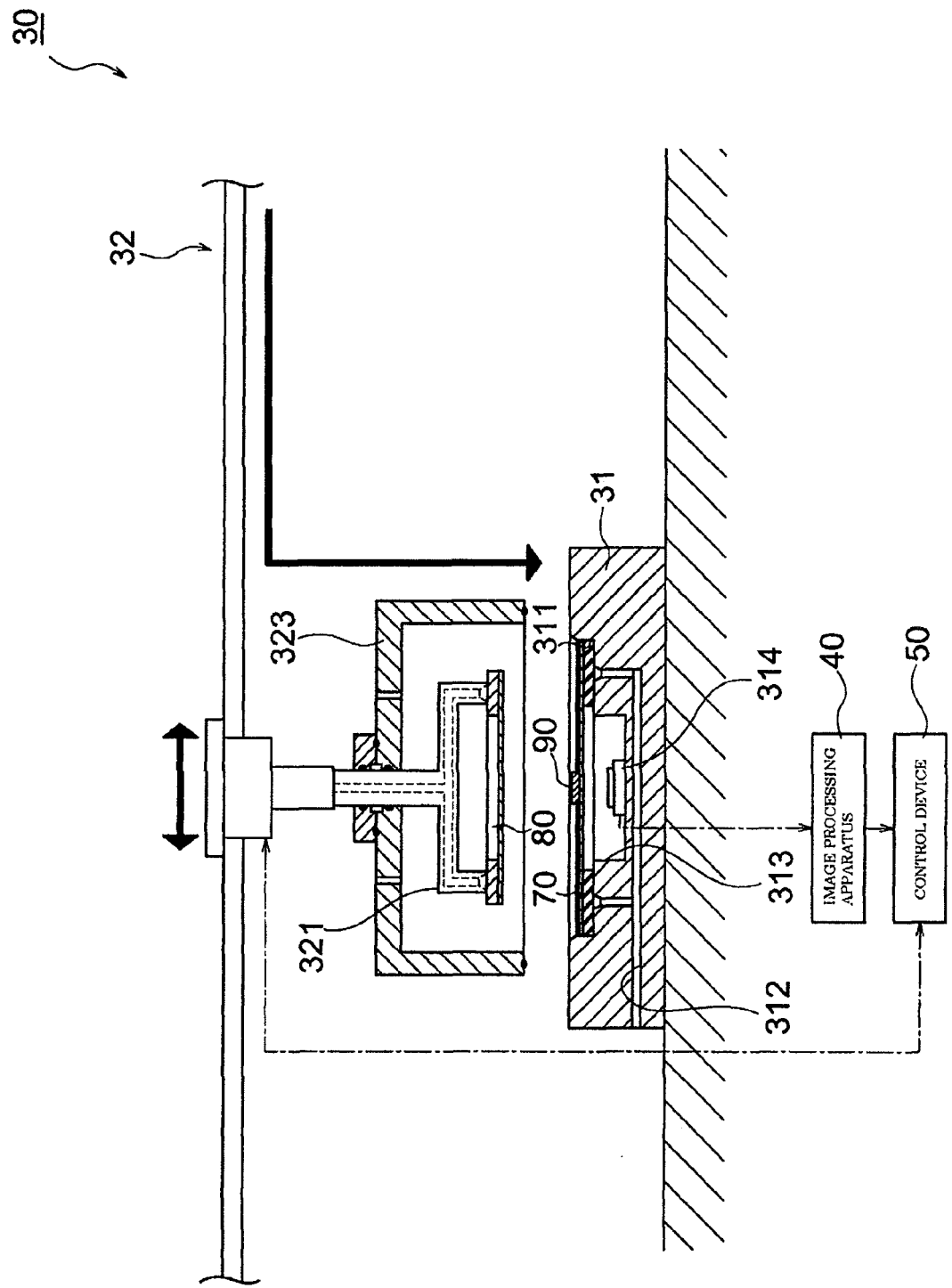
FIG. 10 is a side view of an assembly unit of a die mounting apparatus of FIG. 7.
Figure 11:
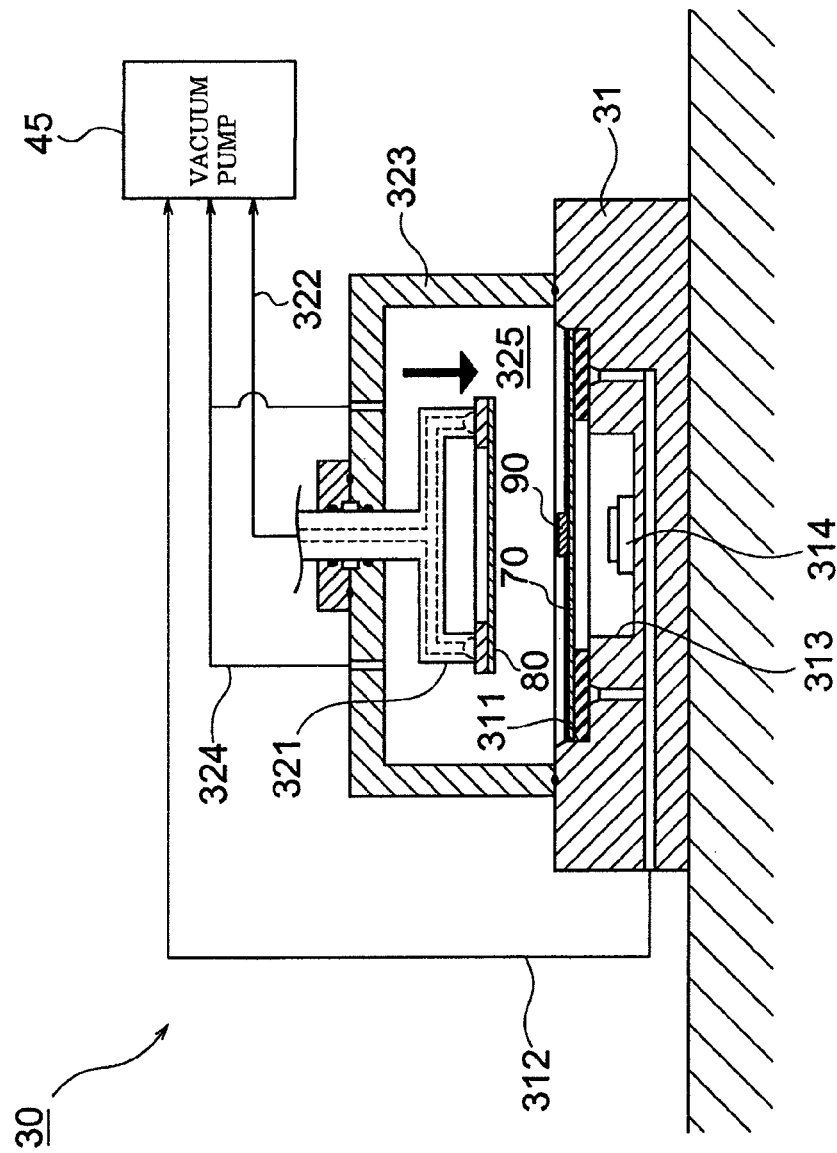
FIG. 11 is a side view of an assembly unit of a die mounting apparatus of FIG. 7.

FIG. 7 is a plan view showing the overall configuration of a die mounting apparatus in the present embodiment, FIG. 8 is a side view showing a base feeding unit of that die mounting apparatus, FIG. 9 is a side view showing a die feeding unit of the die mounting apparatus, and FIG. 10 and FIG. 11 are side views showing an assembly unit of the die mounting apparatus.

The die mounting apparatus 1 in the present embodiment is an apparatus for temporarily mounting a die 90 in a test carrier 60 so as to test an electronic circuit device built into the die 90.

This die mounting apparatus 1, as shown in FIG. 7, comprises: a base feeding unit 10 for feeding a base member 70 to the assembly unit 30 after the first interconnect patterns 78 are formed on the base member 70; a die feeding unit 20 for feeding a die 90 to the assembly unit 30 after the positions of input/output terminals 91 of the die 90 are detected; and an assembly unit 30 for assembling the base member 70, die 90, and cover member 80.

The base feeding unit 10, as shown in FIG. 7 and FIG. 8, comprises: a first conveyor arm 11 for conveying a base member 70; and an interconnect forming module 12 for printing the first interconnect patterns 78 on the surface of the base member 70.

The first conveyor arm 11 has a suction pad 111 for holding a base member 70 by suction and is designed to be able to move the suction pad 111 in three dimensions. This first conveyor arm 11 conveys a base member 70 from a first stocker 13 storing a plurality of the base members 70 to a rotary stage 125 and conveys a printed base member 70 from the rotary stage 125 to an assembly stage 31 of the assembly unit 30.

The interconnect forming module 12 comprises: a movable unit 121 having a printing head 122 and a first camera 123; a movement mechanism for moving the movable unit 121; and a rotary stage 125 for holding a base member 70 on which the first interconnect patterns 78 are to be printed.

The movable unit 121 is provided with the printing head 122 for forming the first interconnect pattern 78 on the base member 70 by ink jet printing. Note that, the printing head 122 may use, instead of ink jet printing, laser printing or another method by which an interconnect can be formed in real time so as to form the first interconnect pattern 78 on the base member 70.

Further, a first camera 123 for imaging a base member 70 is fastened to this movable unit 121. This first camera 123 is designed to be able to transmit an image information in which a base member 70 is imaged to an image processing apparatus 40. The image processing apparatus 40, as explained later, detects the positions of the alignment marks 79 from this image information and, on the basis of those detection results, recognizes the print start positions 782 of the first interconnect patterns 78 (see FIG. 13). Further, the control device 50 controls the interconnect forming module 12 on the basis of the print start positions 782. Note that, this first camera 123 is also used when calibrating a distance $w_0$ between the printing head 122 and the first camera 123.

The movement mechanism 124 has, for example, ball-screw mechanisms etc. and is designed to be able to move the movable unit 121 in three dimensions. Note that, FIG. 7 and FIG. 8 only show the ball-screw mechanism of one direction, but in actually the apparatus comprises a ball-screw mechanism along the X-direction and a ball-screw mechanism along the Y-direction and comprises an elevator mechanism for moving the movable unit 121 up and down.

The rotary stage 125 has two holding parts 126 of recess shapes able to hold base members 70 and is designed to rotate by drive force transmitted from a motor 127. For this reason, it is possible that a first conveyor arm 11 feeds one holding part 126 with a base member 70 while the printing head 122 prints first interconnect patterns 78 on a base member on the other holding part 126.

A base member 70 formed with first interconnect patterns 78 by the above interconnect forming module 12 is conveyed by the first conveyor arm 11 from the rotary stage 125 to the assembly stage 31 of the assembly unit 30.

The die feeding unit 20, as shown in FIG. 7 and FIG. 9, comprises: a second conveyor arm 21 for conveying a die 90; and a second camera 22 for imaging the die 90.

The second conveyor arm 21 has a suction pad 211 for holding a die 90 by suction and is designed to able to move this suction pad 211 in three dimensions. This second conveyor arm 21 conveys a die 90 from a second stocker 23 storing a plurality of dies 90 to the assembly stage 31 of the assembly unit 30.

The second camera 22 images a die 90 from beneath and the die 90 is held by the second conveyor arm 21. This second camera 22, like the first camera 123, is designed to be able to transmit an image information in which a die 90 is imaged to the image processing apparatus 40. The image processing apparatus 40, as explained later, detects the positions of the input/output terminals 91 of the die 90 from this image information and, on the basis of those detection results, recognizes the pad forming positions 781 (see FIG. 14). Further, the control device 50 controls the interconnect forming module 12 on the basis of the pad forming positions 781.

The assembly unit 30, as shown in FIG. 7, FIG. 10, and FIG. 11, comprises: an assembly stage 31 which is supplied by the base feeding unit 10 and the die feeding unit 20 respectively with a base member 70 and a die 90; and an assembly arm 32 which conveys the cover member 80 to the assembly stage 31 and assembles a test carrier 60.

A first recess 311 able to hold a base member 70 is formed at the center part of the assembly stage 31. Further, a first suction line 312 connected to the vacuum pump 45 opens around this first recess 311, whereby a base member 70 can be held by suction. A base member 70 is placed inside this first recess 311 by the first conveyor arm 11. Furthermore, a die 90 is mounted on top of the base member 70 by the second conveyor arm 21.

Further, a second recess 313 is formed at the center part of the first recess 311. A third camera 314 is set inside this second recess 313. This third camera 314 is a camera used for calibration of movement error caused due to the first and second conveyor arms 11 and 21. In the same way as the first and second cameras 123 and 22, the third camera 314 is connected to the image processing apparatus 40.

The assembly arm 32 has a suction pad 321 holding a cover member 80 by suction via a second suction line 322 connected to the vacuum pump 45 and is designed to be able to move the suction pad 321 in three dimensions. This assembly arm 32 conveys a cover member 80 from a third stocker 33 storing a large number of cover members 80 to the assembly stage 31.

Further, the assembly arm 32 has a cylindrical chamber head 323 which has a closed bottom and surrounds the suction pad 321. This chamber head 323 is designed to be able to move up and down relative to the suction pad 321. Further, a third suction line 324 connected to the vacuum pump 45 opens into this chamber head 323. For this reason, by evacuating the air through the third suction line 324 by the vacuum pump 45 in the state that the chamber head 323 is set in close contact with the assembly stage 31, it is possible to reduce the pressure in a sealed space 325 defined by the chamber head 323 and the assembly stage 31.

Next, the method of mounting a die 90 in the test carrier 60 of the present embodiment will be explained while referring to FIG. 12 to FIG. 14.

Figure 12:
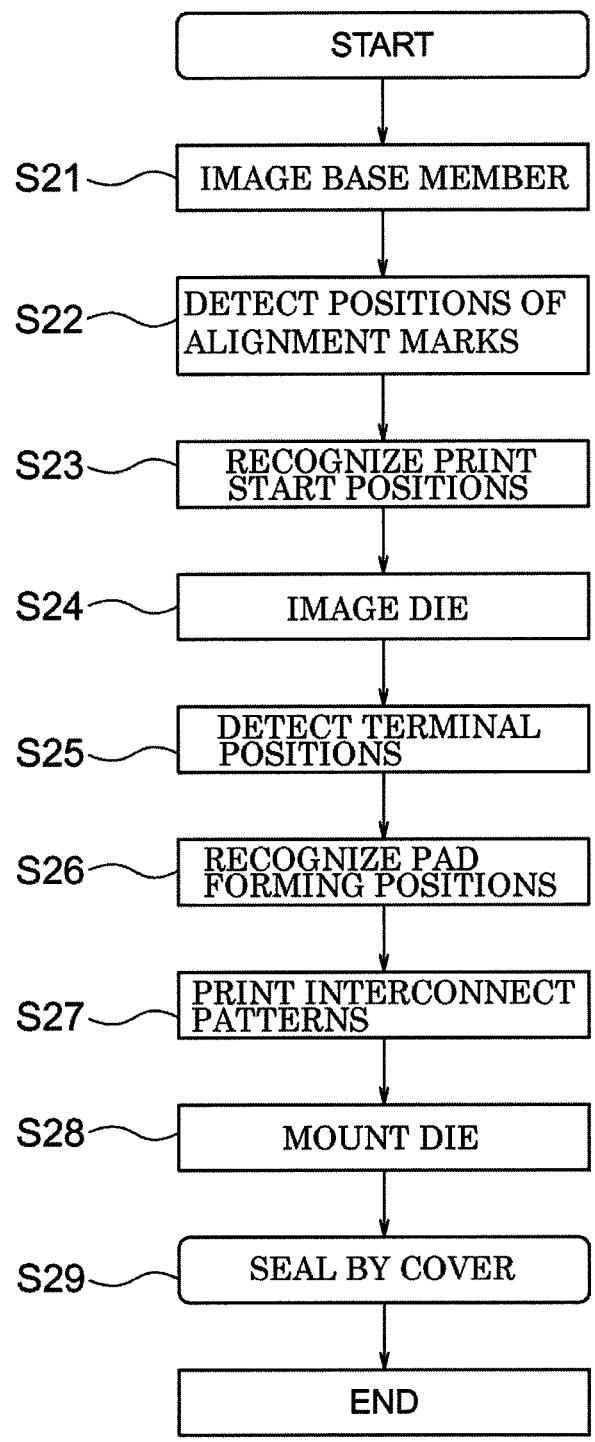
FIG. 12 is a flow chart showing a mounting method of a die on a test carrier in an embodiment of the present invention.
Figure 13:
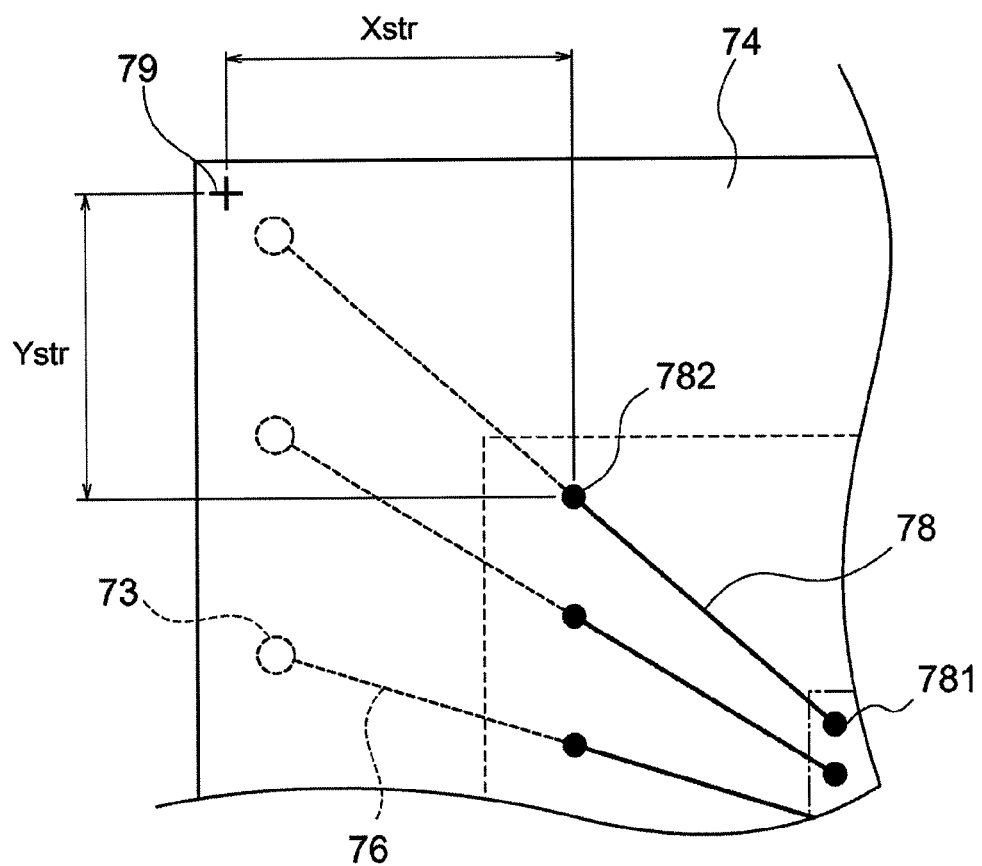
FIG. 13 is a plan view of a base member for explaining step S23 of FIG. 12.
Figure 14:
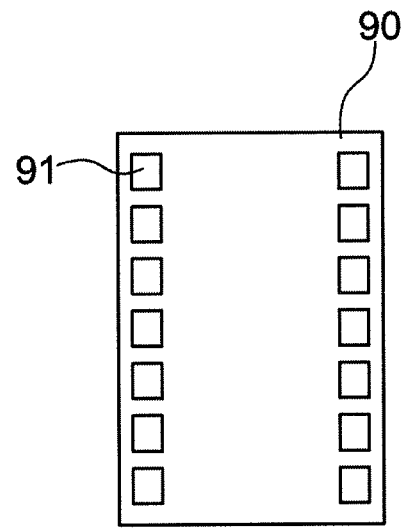
FIG. 14 is a bottom view of a die for explaining step S24 of FIG. 12.

FIG. 12 is a flow chart showing the die mounting method in the present embodiment, while FIG. 13 and FIG. 14 are views for explaining steps S23 and S24 of FIG. 12. Note that, FIG. 12 corresponds to the detailed routine of step S20 in FIG. 1.

As shown in FIG. 12, first, the first conveyor arm 11 conveys a base member 70 from the first stocker 13 to the rotary stage 125, and the first camera 123 images the base member 70 (step S21).

The first camera 123 sends the image information in which the base member 70 is imaged (a first image information) to the image processing apparatus 40. The image processing apparatus 40 processes the image information and detects the positions of the alignment marks 79 at two locations (step S22).

Next, as shown in FIG. 13, the image processing apparatus 40 calculates the print start position 782 on the basis of the position of the alignment mark 79 and the relative position $(X_{str}, Y_{str})$ of the print start position 782 of the first interconnect pattern 78 with respect to the alignment mark 79 (step S23). Note that, the relative position $(X_{str}, Y_{str})$ of the print start position 782 with respect to the alignment mark 79 is stored in the image processing apparatus 40 in advance.

Further, in the present embodiment, the positions of the alignment marks 79 at the two locations are detected at step S22, so when the flexible board 74 is tilted relative to the rigid board 71, that tilt is also considered when calculating the print start positions 782.

Next, the second conveyor arm 21 conveys a die 90 from the second stocker 23 to above the second camera 22, and the second camera 22 images that die 90 (step S24).

The second camera 22 sends the image information in which the die 90 is imaged (a second image information) to the image processing apparatus 40. As shown in FIG. 14, the image processing apparatus 40 processes the image information to detect the positions of the input/output terminals 91 of the die 90 (step S25) and recognizes the pad forming positions 781 of the first interconnect patterns 78 on the basis of the positions of the input/output terminals 91 (step S26).

Next, the image processing apparatus 40 sends the pad forming positions 781 to the control device 50. Further, the control device 50 sends the interconnect forming module 12 an instruction signal so as to form first interconnect patterns 78 between the print start positions 782 and pad forming positions 781. The interconnect forming module 12 forms first interconnect patterns 78 on the surface of the flexible board 74 of the base member 70 by ink jet printing on the basis of this instruction signal (step S27).

Next, the first conveyor arm 11 conveys the base member 70 from the rotary stage 125 to the assembly stage 31 and the second conveyor arm 21 mounts a die 90 on the base member 70 (step S28). Next, the chamber head 323 is set in close contact with the assembly stage 31, the pressure inside the sealed space 325 is reduced by the vacuum pump 45, then the assembly arm 32 places a cover member 80 over the base member 70. Next, the vacuum pump 45 stops so as to return the inside of the sealed space 325 to atmospheric pressure and thereby the die 90 is hold between the base member 70 and the cover member 80, and the test carrier 60 is completed (step S29).

The test carrier 60 in which the die 90 is mounted in the above way is sent to the test step S30 of FIG. 1. At this test step S30, the connection terminals 73 of the test carrier 60 and the contractors of the test apparatus are electrically brought into contact whereby the die 90 is electrically connected to the test apparatus through the test carrier 60 and the electronic circuit device built into the die 90 is tested.

When the die 90 finishes being tested, at the disassembly step S40, the base member 70 and the cover member 80 are disassembled and the die 90 is taken out from the test carrier 60. Next, this die 90 is final-packaged, whereby the device is completed as a final product (step S50).

As mentioned above, in the present embodiment, the print start positions 782 are recognized on the basis of the positions of the alignment marks 79 provided on the flexible board 74 of a base member 70, so it is possible to accurately form the first interconnect patterns 78 on the flexible board 74.

Further, in the present embodiment, the pad forming positions 781 are recognized on the basis of the positions of the input/output terminals 91 of the die 90, so even if the second conveyor arm 21 holds a die 90 by suction on a bias or there is manufacturing variation in the positions of the input/output terminals 91 in the dies 90, these can be absorbed.

Next, the calibration method of movement error occurring due to the conveyor arms 11 and 21 of the die mounting apparatus 1 in the present embodiment will be explained while referring to FIG. 15 and FIG. 16.

Figure 15:
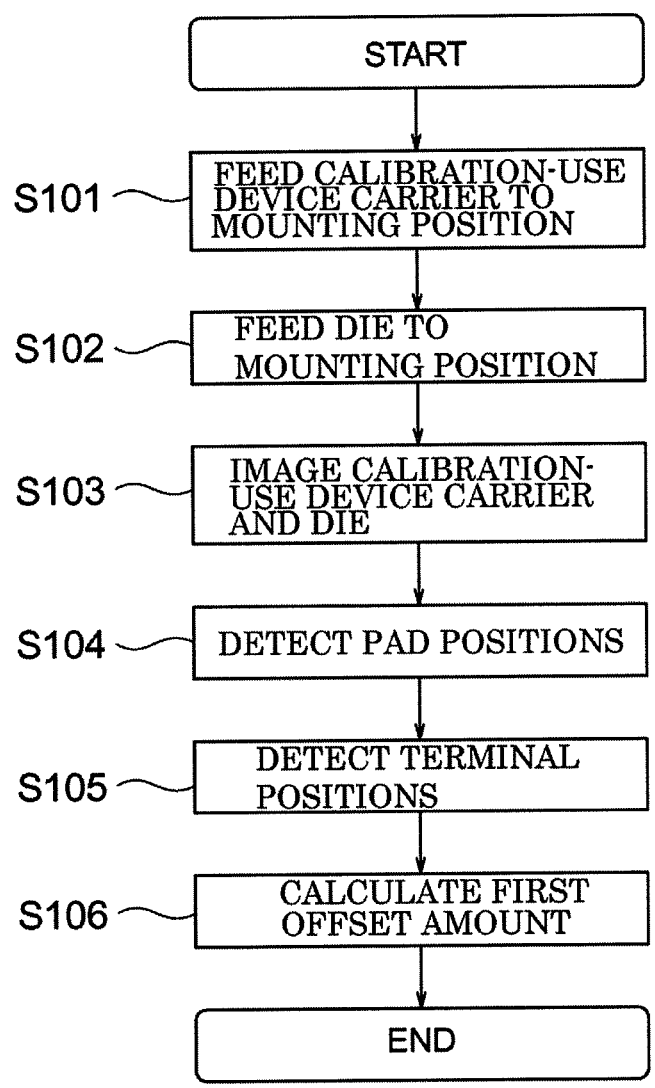
FIG. 15 is a flow chart showing a calibration method of movement error caused due to first and second conveyor arms of a die mounting apparatus in an embodiment of the present invention.
Figure 16:
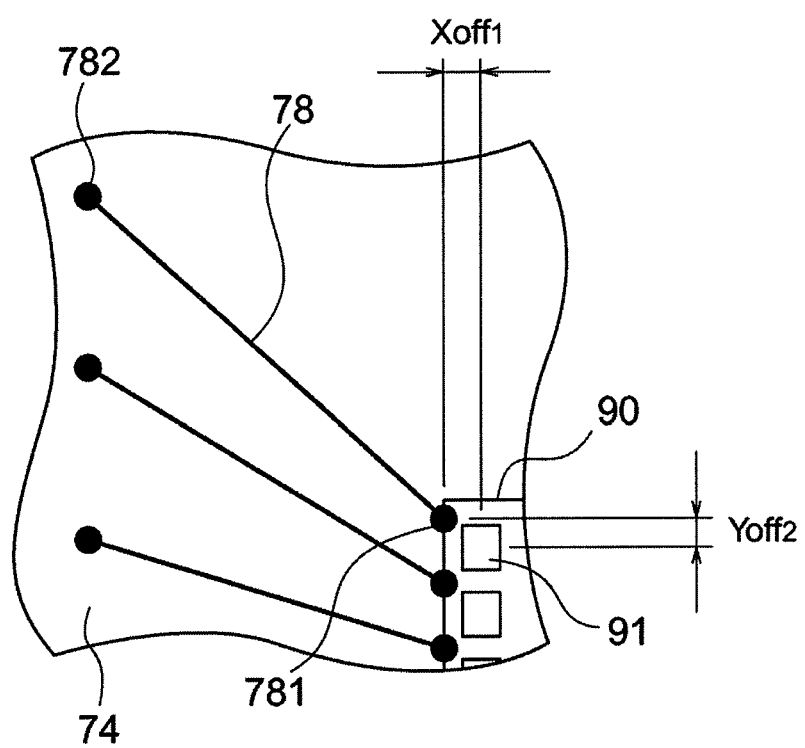
FIG. 16 is a bottom view of a base member and die for explaining step S106 of FIG. 15.

FIG. 15 is a flow chart showing a calibration method of movement error occurring due to the first and second conveyor arms of the die mounting apparatus in the present embodiment, while FIG. 16 is a view for explaining step S106 of FIG. 15.

First, the first conveyor arm 11 conveys a calibration-use base member to the assembly stage 31 (FIG. 15, step S101) and the second conveyor arm 21 mounts a die 90 on the calibration-use base member (step S102).

Note that, while not particularly shown, the calibration-use base member differs from the above-mentioned base member 80 in the point that the flexible board comprises a thin film. Further, first interconnect patterns 78 are formed on the surface of the calibration-use base member according to the same routine as step S21 to step S27 of FIG. 12.

Next, the third camera 314 images the calibration-use base member and the die 90 from beneath (step S103), then the third camera 314 sends the image information in which the calibration-use base member and die 90 are imaged (a third image information) to the image processing apparatus 40. The image processing apparatus 40 processes that image information to detect the positions of the pads 781 of the first interconnect patterns 78 printed on the calibration-use base member and the positions of the input/output terminals 91 of the die 90 (step S104 and step S105).

Next, the image processing apparatus 40, as shown in FIG. 16, calculates the offset amount of the input/output terminal 91 with respect to the pad 781 (a first offset amount ($X_{off1}$, $Y_{off1}$)) and sends the calculation result to the control device 50. The control device 50, for example, at step S28 of FIG. 12, controls the second conveyor arm 21 so as to cancel this first offset amount ($X_{off1}$, $Y_{off1}$). Note that, the control device 50, for example, at step S27 of FIG. 12, may also control the interconnect forming module 12 so as to cancel this first offset amount ($X_{off1}$, $Y_{off1}$).

Due to this, the movement error occurring due to the first and second conveyor arms 11, 21 can be eliminated, so it is possible to accurately form the first interconnect patterns 78 on the flexible board 74 of the base member 70. Note that, the above-explained calibration of the movement error is performed at a specific timing, for example, at the time of a change of the lot of the dies 90, the time of starting work, etc.

Next, the calibration method of the interconnect forming module 12 of the die mounting apparatus 1 in the present embodiment will be explained while referring to FIG. 17 and FIG. 18.

Figure 17:
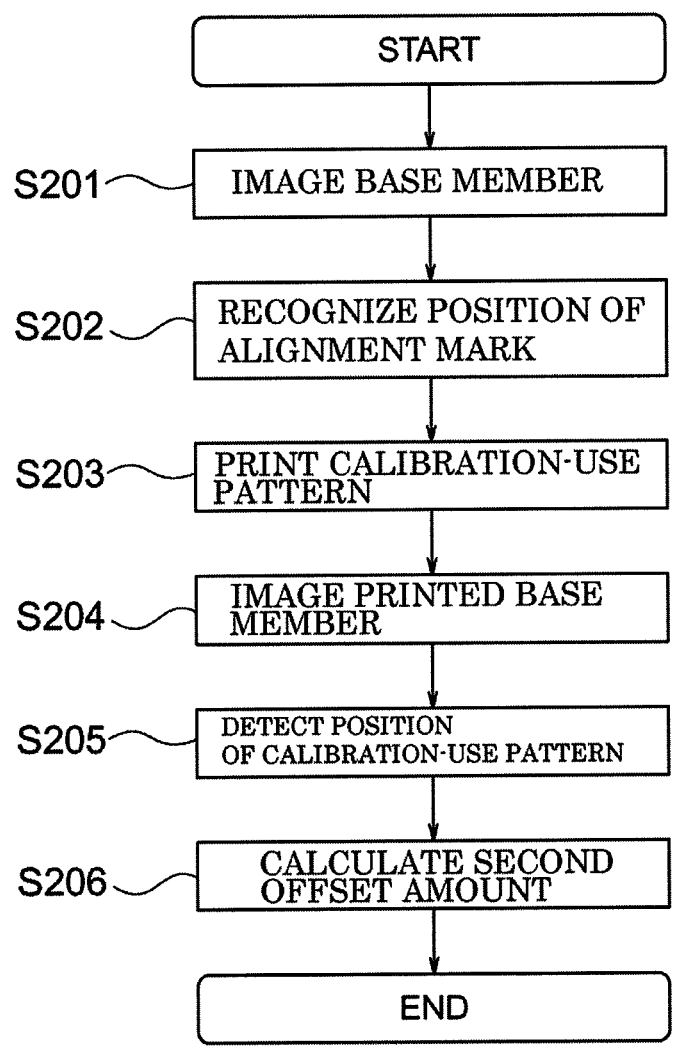
FIG. 17 is a flow chart showing a calibration method of an interconnect forming module of an electronic device mounting apparatus in an embodiment of the present invention.
Figure 18:
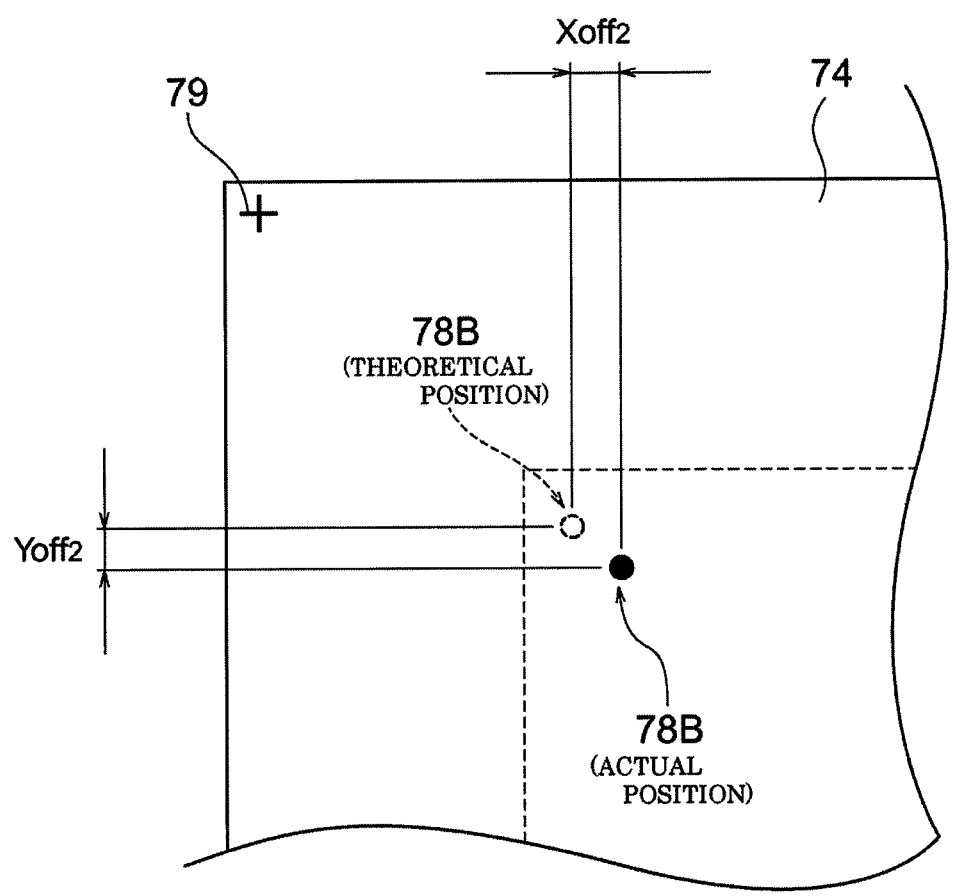
FIG. 18 is a plan view of a base member for explaining step S203 of FIG. 17.

FIG. 17 is a flow chart showing the calibration method of an interconnect forming module of the die mounting apparatus in the present embodiment, while FIG. 18 is a view for explaining step S203 of FIG. 17.

First, the first conveyor arm 11 conveys a base member 70 on the rotary stage 125, then the first camera 123 images an image of that base member 70 (step S201 of FIG. 17). The first camera 123 sends the image information in which the base member 70 is imaged (a fourth image information) to the image processing apparatus 40. The image processing apparatus 40 processes that image information to detect the position of the alignment mark 79 (step S202).

Next, the interconnect forming module 12, as shown in FIG. 18, uses the printing head 122 to print a calibration-use interconnect pattern 78B on the flexible board 74 (step S203). Note that, the shape of the calibration-use interconnect pattern 78B is not particularly limited.

Next, the first camera 123 images the base member 70 again (step S204). The first camera 123 sends the image information in which the printed base member 70 is imaged (a fifth image information) to the image processing apparatus

40. The image processing apparatus 40 processes that image information to detect the position of the calibration-use interconnect pattern 78B (step S205).

Next, the image processing apparatus 40 calculates the theoretical position of the calibration-use interconnect pattern 78B from the position of the alignment mark 79. Furthermore, the image processing apparatus 40 compares the theoretical position and the actual position of the calibration-use interconnect pattern 78B detected at step S205 to calculate the offset amount of the actual position with respect to the theoretical position (a second offset amount ($X_{off2}$, $Y_{off2}$) and sends the calculation result to the control device 50. The control device 50, for example, at step S27 of FIG. 12, controls the interconnect forming module 12 so as to cancel this second offset amount ($X_{off2}$, $Y_{off2}$).

Due to this, it is possible to eliminate the fluctuation of the distance $w_0$ between the printing head 122 and the first camera 123 in the interconnect forming module 11 (see FIG. 8), so it is possible to accurately form the first interconnect patterns 78 on the flexible board 74 of the base member 70. Note that, the above-explained calibration of the interconnect module 12 is performed at a specific timing, for example, at the time of a change of the lot of the dies 90, the time of starting work, etc.

Note that, the above explained embodiments were described for facilitating understanding of the present invention and were not described for limiting the present invention. Therefore, the components disclosed in the embodiments include all design changes and equivalents falling under the technical scope of the present invention.

REFERENCE SIGNS LIST

1 . . . die mounting apparatus
10 . . . base feeding unit
11 . . . first conveyor arm
12 . . . interconnect forming module
122 . . . printing head (interconnect forming device)
123 . . . first camera (first imaging device)
20 . . . die feeding unit
21 . . . second conveyor arm (mounting device)
22 . . . second camera (second imaging device)
30 . . . assembly unit
31 . . . assembly stage
314 . . . third camera (third imaging device)
32 . . . assembly arm
40 . . . image processing apparatus (first to fourth recognizing device)
60 . . . test carrier
70 . . . base member
701 . . . first region
702 . . . second region
71 . . . rigid board (first board)
74 . . . flexible board (second board)
75 . . . base film
76 . . . second interconnect pattern
77 . . . coverlay
78 . . . first interconnect pattern
781 . . . pad
782 . . . print start position
79 . . . alignment mark
80 . . . cover member
90 . . . die

The invention claimed is:

1. An electronic device mounting apparatus temporarily mounting an electronic device on a test carrier for testing, the test carrier having a base member and a cover member between which the electronic device is sandwiched, the electronic device mounting apparatus comprising:
   a first imaging device configured to image the base member independently from the electronic device so as to generate a first image information;
   a first recognizing device configured to detect a position of a first predetermined part of the base member from the first image information and recognize a forming start position of a first interconnect pattern on the base member on the basis of the position of the first predetermined part;
   a second imaging device configured to image the electronic device independently from the base member so as to generate a second image information;
   a second recognizing device configured to detect a position of an input/output terminal of the electronic device from the second image information and recognize a pad forming position on the base member on the basis of the position of the input/output terminal;
   an interconnect forming device configured to form the first interconnect pattern on the surface of the base member between the forming start position and the pad forming position; and
   a mounter configured to mount the electronic device on the base member on which the first interconnect pattern is formed.

2. The electronic device mounting apparatus as set forth in claim 1, wherein the first predetermined part of the base member is a mark formed on a surface of the base member.

3. The electronic device mounting apparatus as set forth in claim 1, wherein the interconnect forming device prints the first interconnect pattern on the base member by ink jet printing.

4. The electronic device mounting apparatus as set forth in claim 3, wherein the test carrier has:
   a first region in which the first interconnect pattern is to be printed by the interconnect forming device; and
   a second region in which a second interconnect pattern is formed in advance.

5. The electronic device mounting apparatus as set forth in claim 1, wherein the electronic device is a die diced from a semiconductor wafer.

6. An electronic device mounting method temporarily mounting an electronic device on a test carrier for testing, the test carrier having a base member and a cover member between which the electronic device is sandwiched, the electronic device mounting method comprising:
   imaging the base member independently from the electronic device so as to generate a first image information;
   detecting a position of a first predetermined part of the base member from the first image information and recognizing a first forming start position of a first interconnect pattern on the base member on the basis of the position of the first predetermined part;
   imaging the electronic device independently from the base member so as to generate a second image information;
   detecting a position of an input/output terminal of the electronic device from the second image information and recognizing a first pad forming position on the base member on the basis of the position of the input/output terminal;
   forming the first interconnect pattern on the surface of the base member between the first forming start position and the first pad forming position; and
   mounting the electronic device on the base member on which the first interconnect pattern is formed.

7. The electronic device mounting method as set forth in claim 6, wherein the first predetermined part of the base member is a mark formed on a surface of the base member.

8. The electronic device mounting method as set forth in claim 6, further comprising:
- imaging a calibration-use base member independently from the electronic device so as to generate a third image information, the calibration-use base member comprising a thin film;
- detecting a position of a second predetermined part of the calibration-use base member from the third image information and recognizing a second forming start position of a second interconnect pattern on the calibration-use base member on the basis of the position of the second predetermined part;
- imaging the electronic device independently from the calibration-use base member so as to generate a fourth image information;
- detecting a position of an input/output terminal of the electronic device from the fourth image information and recognizing a second pad forming position on the calibration-use base member on the basis of the position of the input/output terminal;
- forming the second interconnect pattern on the calibration-use base member between the second forming start position and the second pad forming position;
- mounting the electronic device on the calibration-use base member on which the second interconnect pattern is formed;
- imaging the calibration-use base member and the electronic device mounted on the calibration-use base member so as to generate a fifth image information; and
- detecting a position of an input/output terminal of the electronic device and a position of a pad on the calibration-use base member from the fifth image information and recognizing a first offset amount of the input/output terminal with respect to the pad on the basis of the position of the input/output terminal and the position of the pad.

9. The electronic device mounting method as set forth in claim 8, wherein the electronic device is mounted on the base member so as to cancel the first offset amount.

10. The electronic device mounting method as set forth in claim 6, further comprising:
- using a first imaging device to image the base member so as to generate a sixth image information;
- detecting a position of the first predetermined part of the base member from the sixth image information;
- using an interconnect forming device to form a calibration-use interconnect pattern on the base member;
- using the first imaging device to image the base member on which the calibration-use interconnect pattern is formed to generate a seventh image information;
- detecting a position of the calibration-use interconnect pattern from the seventh image information; and
- (n) recognizing a second offset amount of the first imaging device with respect to the interconnect forming device on the basis of the position of the first predetermined part and the position of the calibration-use interconnect pattern.

11. The electronic device mounting method as set forth in claim 10, wherein the first interconnect pattern is formed on the base member so as to cancel the second offset amount.

12. The electronic device mounting method as set forth in claim 6, wherein the first interconnect pattern is printed on the base member by ink jet printing.

13. The electronic device mounting method as set forth in claim 12, wherein the test carrier has:
- a first region in which the first interconnect pattern is to be printed; and
- a second region in which a third interconnect pattern is formed in advance.

14. The electronic device mounting method as set forth in claim 6, wherein the electronic device is die diced from a semiconductor wafer.

* * * * *